(12) United States Patent
Mizuguchi et al.

(10) Patent No.: US 6,707,228 B2
(45) Date of Patent: Mar. 16, 2004

(54) METHOD FOR ADJUSTING FREQUENCY OF ELECTRONIC COMPONENT

(75) Inventors: Takashi Mizuguchi, Shiga-Ken (JP); Shoichi Kawabata, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 433 days.

(21) Appl. No.: 09/816,898

(22) Filed: Mar. 23, 2001

(65) Prior Publication Data

US 2001/0030293 A1 Oct. 18, 2001

(30) Foreign Application Priority Data

Mar. 31, 2000 (JP) ........................................ 2000-097370

(51) Int. Cl.⁷ .............................. H01L 41/22; H03H 9/15
(52) U.S. Cl. ................... 310/313 R; 250/492.3; 250/492.2; 333/193; 427/100; 29/25.35
(58) Field of Search ..................... 310/313 R; 333/193; 250/492.3, 492.2; 427/100; 29/25.35

(56) References Cited

U.S. PATENT DOCUMENTS

| | | |
|---|---|---|
| 5,662,782 A | 9/1997 | Gomi et al. |
| 5,707,684 A * | 1/1998 | Hayes et al. ................. 427/162 |
| 5,815,900 A * | 10/1998 | Ichikawa et al. .......... 29/25.35 |
| 6,456,173 B1 * | 9/2002 | Ella et al. .................... 333/188 |

FOREIGN PATENT DOCUMENTS

| | | |
|---|---|---|
| JP | 1-316472 | 12/1989 |
| JP | 4-196707 | 7/1992 |
| JP | 4-196708 | 7/1992 |
| JP | 6-57451 | 3/1994 |
| JP | 6-116709 | 4/1994 |
| JP | 8-181558 | 7/1996 |

* cited by examiner

*Primary Examiner*—Nikita Wells
(74) *Attorney, Agent, or Firm*—Keating & Bennett, LLP

(57) ABSTRACT

A method for adjusting the frequency of an electronic component device includes the step of etching an electrode disposed on a surface of the electronic component device by irradiating an ion beam onto the electrode. The ion beam irradiation is performed while moving at least one of the electronic component device and the ion beam in directions along the surface on which the electrode is disposed.

21 Claims, 5 Drawing Sheets

METHOD FOR ADJUSTING FREQUENCY OF ELECTRONIC COMPONENT

BACKGROUND OF THE INVENTION

1. Field of the Invention

The present invention relates to methods for adjusting the frequencies of electronic components such as piezoelectric oscillators and surface acoustic wave devices, and more specifically, the present invention relates to methods for adjusting the frequencies of electronic components via ion-beam etching.

2. Description of the Related Art

Conventionally, in piezoelectric oscillators and surface acoustic wave devices, a conventional method for adjusting the frequency thereof includes irradiating an electrode disposed on a piezoelectric substrate with an ion beam to perform etching thereon. In this case, the piezoelectric substrate having the electrode disposed thereon is arranged in a fixed manner. The ion beam is applied from an ion gun arranged in a fixed manner at a predetermined distance from the surface on which the electrode of the piezoelectric substrate is disposed.

In addition, in Japanese Unexamined Patent Application Publication No. 8-181558, there is provided a method for changing the distance between an ion gun and an electronic component in order to control an etching speed. Furthermore, in Japanese Unexamined Patent Application Publication No. 4-196707, Japanese Unexamined Patent Application Publication No. 4-196708, and other publications, there are provided apparatuses for changing the directions of ion beams with magnetic fields and electric fields to allow only neutral particles to collide with the electrodes of electronic components.

An ion beam has an intensity distribution. Thus, as in the conventional methods, when ion beams are simply applied from the ion gun arranged in the fixed manner with respect to the electrode of an electronic component, variations in the processing amount occur according to positions. As a result, depending on the type of electronic components, the processing variations significantly influence the characteristics thereof, with the result that the frequency of the electronic components cannot be adjusted with high quality and high accuracy.

The processing variations caused by the ion-beam etching can be reduced to some extent by varying the distance between the ion gun and the electronic component, discharging conditions, and the configuration of a beam emitting hole. However, with such solutions, there is a limitation to reduction of the process variations.

In addition, when a very small part such as the electrode of an electronic component is irradiated with an ion beam to be etched, if a slight deviation of the center of the ion beam occurs, the symmetry of a region for etching is destroyed, with the result that the influence on the characteristics is even more increased. Therefore, the adjustment of the position of the ion gun requires very high accuracy. Thus, there is a problem in that the maintenance and adjustment of the ion gun is very complicated.

SUMMARY OF THE INVENTION

In order to overcome the problems described above, preferred embodiments of the present invention provide a method for adjusting the frequency of an electronic component which minimize variations in etching when an ion beam etching is performed on the electrode of the electronic component to achieve highly accurate frequency adjustment. In addition, with the method of preferred embodiments of the present invention, the frequency adjustment can be performed with high quality and high accuracy, while simplifying complicated work such as the maintenance and adjustment of an ion gun.

Preferred embodiments of the present invention provide a method for adjusting the frequency of an electronic component device by irradiating an electrode disposed on a surface of the electronic component device with an ion beam to perform etching, in which the ion beam irradiation is performed while moving at least one of the electronic component device and the ion beam in directions along the surface on which the electrode is disposed.

In one preferred embodiment of the present invention, the ion beam irradiation is performed while moving at least one of the electronic component device and the ion beam in one direction along the surface on which the electrode is disposed.

In another preferred embodiment of the present invention, a surface acoustic wave device defines the electronic component device and includes an interdigital transducer having a plurality of electrode fingers disposed on a surface of a piezoelectric substrate, and the ion beam irradiation is performed while moving at least one of the surface acoustic wave device and the ion beam in a direction in which the electrode fingers extend.

In another preferred embodiment of the present invention, when the ion beam irradiation is performed, the ion beam is bent by applying an electric field or a magnetic field.

In the method for adjusting the frequency of an electronic component according to another preferred embodiment of the present invention, an electrode of the electronic component device or a substrate is etched by ion-beam etching to achieve highly accurate frequency adjustments. In this case, the ion beam irradiation is performed while moving at least one of the electronic component device and the ion beam in directions along a surface on which the electrode is disposed. Thus, variations in the etched amount of a region for etching are minimized, with the result that the frequency adjustment is performed with high quality and high accuracy.

In the conventional method, the ion beam irradiation is performed by arranging an ion gun and an electronic component device in a fixed manner. Thus, symmetry of the processing amount is destroyed when the center of the ion beam even slightly deviates, thereby causing an increase in influences on the characteristics of the electronic component. In contrast, in the present invention, since ion beam irradiation is performed while moving at least one of the electronic component device and the ion beam in the directions along the surface on which the electrode is disposed, the processing symmetry is prevented from being destroyed. Thus, the positioning and maintenance of an ion gun can be simplified and results in much more accurate frequency adjustment.

Particularly, when the ion radiation range is made broader than the surface on which the electrode of the electronic component device is disposed, it is unnecessary to adjust the positions of both ends of the range in which the ion beam is moved relatively thereto. As a result, the positioning and maintenance of the ion gun is much easier.

When the ion beam irradiation is performed while moving at least one of the electronic component device and the ion beam in directions along the surface on which the electrode is disposed, it is only necessary to move at least one of the electronic component device and the ion beam only in a certain direction. As a result, great advantages are obtained with the simplified apparatus and control.

For the purpose of illustrating the present invention, there is shown in the drawings several forms that are presently preferred, it being understood, however, that the present invention is not limited to the precise arrangements and instrumentalities shown.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
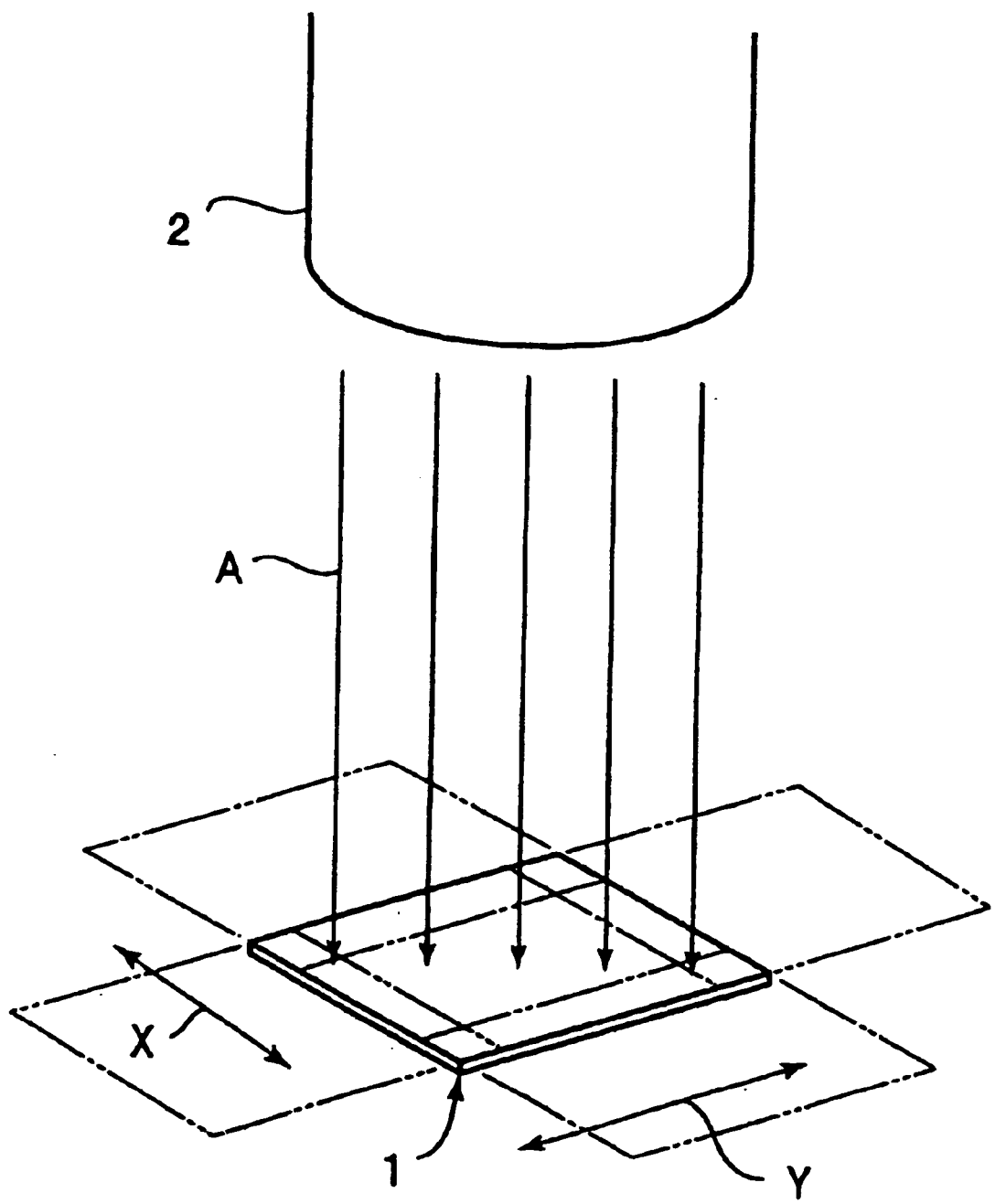
FIG. 1 is a schematic perspective view for illustrating adjustments to the frequency of an electronic component according to a preferred embodiment of the present invention.
Figure 2:
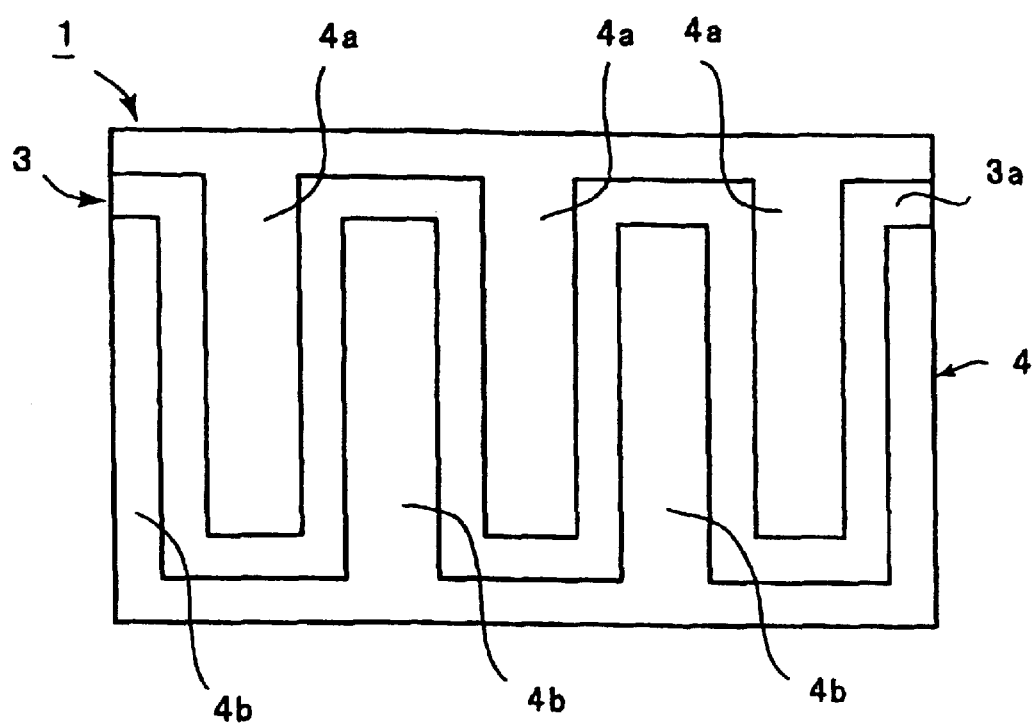
FIG. 2 is a plan view showing a surface acoustic wave device as an electronic component having a frequency that is adjusted by the method according to a preferred embodiment of the present invention.

FIG. 1 is a schematic perspective view for illustrating a method for adjusting the frequency of an electronic component according to a preferred embodiment of the present invention. FIG. 2 is a plan view schematically showing the electrode structure of a surface acoustic wave device as an electronic component device having a frequency that is adjusted with the method according to the preferred embodiment of the present invention illustrated in FIG. 1.

As shown in FIG. 1, an ion gun 2 is arranged above a surface acoustic wave device 1. In FIG. 1, the surface acoustic wave device 1 is schematically shown, and the electrode structure of the surface acoustic wave device 1 is omitted.

As shown in FIG. 2, in the surface acoustic wave device 1, an interdigital transducer 4 is arranged on an upper surface 3a of a piezoelectric substrate 3. The interdigital transducer 4 has a plurality of electrode fingers 4a and 4b that are interdigitated with each other.

The electrode defining the interdigital transducer 4 is preferably made of an appropriate conductive material such as Al or Ag, or other suitable material.

In this preferred embodiment, either of the electrode fingers 4a and 4b or the piezoelectric substrate 3, or both of these elements are etched to adjust the frequency of the surface acoustic wave device 1.

As shown in FIG. 1, the surface acoustic wave device 1 is arranged on a movable stage, which is not shown in the figure. In this preferred embodiment, the movable stage is arranged such that the surface acoustic wave device 1 can be moved in the direction of arrow X and in the direction of arrow Y shown in the figure, that is, the short-sideline direction and long-sideline direction of the piezoelectric substrate 3. The movable stage may include a stage for mounting the surface acoustic wave device 1 and a driving unit allowing the stage to move in the X direction and the Y direction. The driving unit is not a specified one, and can include a motor and an appropriate coupling mechanism or the like, coupled to the motor.

The ion gun 2 can be an appropriate conventionally known ion gun, which can perform irradiation with an ion beam.

In this preferred embodiment, in the initial situation, the surface acoustic wave device 1 is mounted on the movable stage, and the ion gun 2 is arranged above the surface acoustic wave device 1. With an ion beam A applied from the ion gun 2, etching is performed on either of the electrode fingers 4a and 4b of the interdigital transducer 4 or the piezoelectric substrate 3, or both of these elements, to adjust the frequency. In this case, preferably, a measuring system for measuring the characteristics of the surface acoustic wave device 1 is connected to the surface acoustic wave device 1. Then, it is preferable that, while measuring the frequency characteristics of the surface acoustic wave device 1, the ion beam A is applied from the ion gun 2. When the ion beam A is applied, the movable stage is moved in the X direction and/or the Y direction. In other words, irradiation with the ion beam A is performed while moving the surface acoustic wave device 1 in the X direction and/or in the Y direction.

Thus, in a region of the surface acoustic wave device 1, on which the ion beam irradiation is performed, variations in the intensity distribution of the ion beam are minimized so that the etching amount is uniform. As a result, characteristic quality deterioration due to non-uniformity in the processing amount is prevented, and highly accurate frequency adjustments are performed.

The effects obtained by reducing the processing variations vary with the distance and speed required when the surface acoustic wave device 1 is moved in the X direction and/or the Y direction. The effects can be appropriately set according to the amount required to adjust the frequency and the surface acoustic wave device 1 as the target for the adjustment.

In addition, in this preferred embodiment, preferably, irradiation with the ion beam A is performed while moving the surface acoustic wave device 1 in the direction in which the electrode fingers 4a and 4b of the interdigital transducer 4 extend, that is, in the X direction. In other words, in many cases, in the surface acoustic wave device 1, variations in the etching amount in the direction in which the electrode fingers 4a and 4b extend significantly influence the frequency characteristics. Therefore, irradiation with the ion beams A is performed while moving the surface acoustic wave device 1 in the X direction, by which variations in etching in the X direction are minimized. As a result, the occurrence of ripples is prevented so that more satisfactory frequency characteristics can be obtained. As shown here, these advantages are achieved only by moving the surface acoustic wave device 1 only in one axis direction. Thus, movement of the surface acoustic wave device 1 can easily be controlled, and the great advantages can be obtained with such a simplified mechanism.

Figure 3:
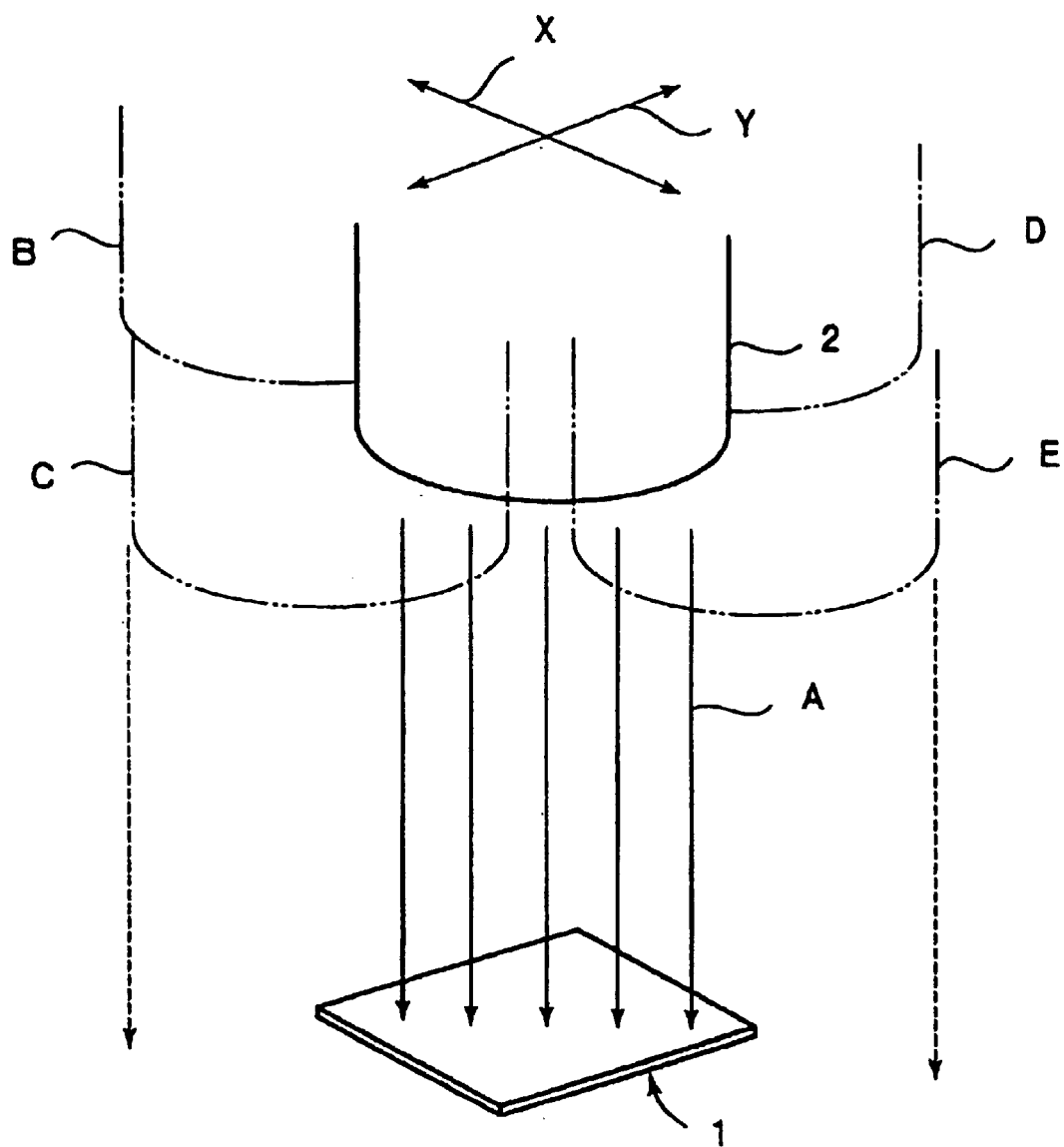
FIG. 3 is a schematic perspective view for illustrating a frequency adjustment method according to a modified example of the preferred embodiment shown in FIG. 1.

In the first preferred embodiment shown in FIG. 1, the ion gun 2 is arranged in the fixed manner, and the surface acoustic wave device 1 arranged on the movable stage is moved together with the movable stage in the X direction and the Y direction. However, as shown in FIG. 3, after arranging the surface acoustic wave device 1 in a fixed manner, the ion gun may be moved in the X direction and/or the Y direction. In FIG. 3, dash-double-dot lines B to E virtually indicate the positions of the moved ion gun 2.

Figure 4:
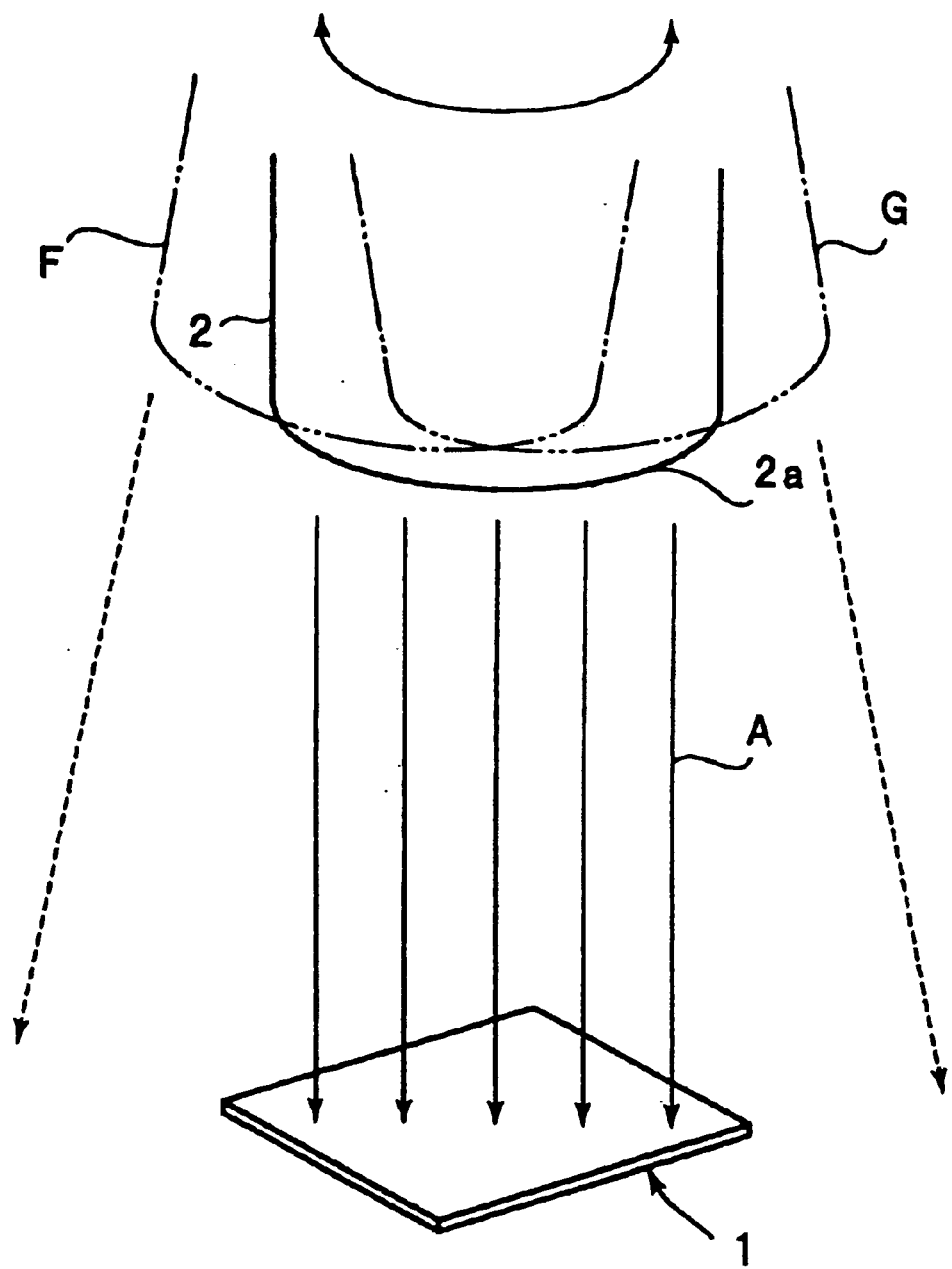
FIG. 4 is a schematic perspective view for illustrating a frequency adjustment method according to a second modified example of the preferred embodiment shown in FIG. 1.

Furthermore, in the frequency adjustment method according to the present preferred embodiment of the present invention, it is only necessary to perform irradiation with the ion beam while moving the ion beam in the directions along the surface on which the electrode of the electronic component device is disposed. There is no specific limitation to the way for moving the ion gun 2. For example, as shown in FIG. 4, the ion gun 2 may be moved in such a manner that a lower surface 2a on which the irradiation hole of the ion gun 2 rotates around the axis direction of the ion gun 2. In other words, the ion beam A may be moved in the X direction and/or in the Y direction by allowing the ion gun 2 to move as shown by dash-double-dot lines F and G.

Figure 5:
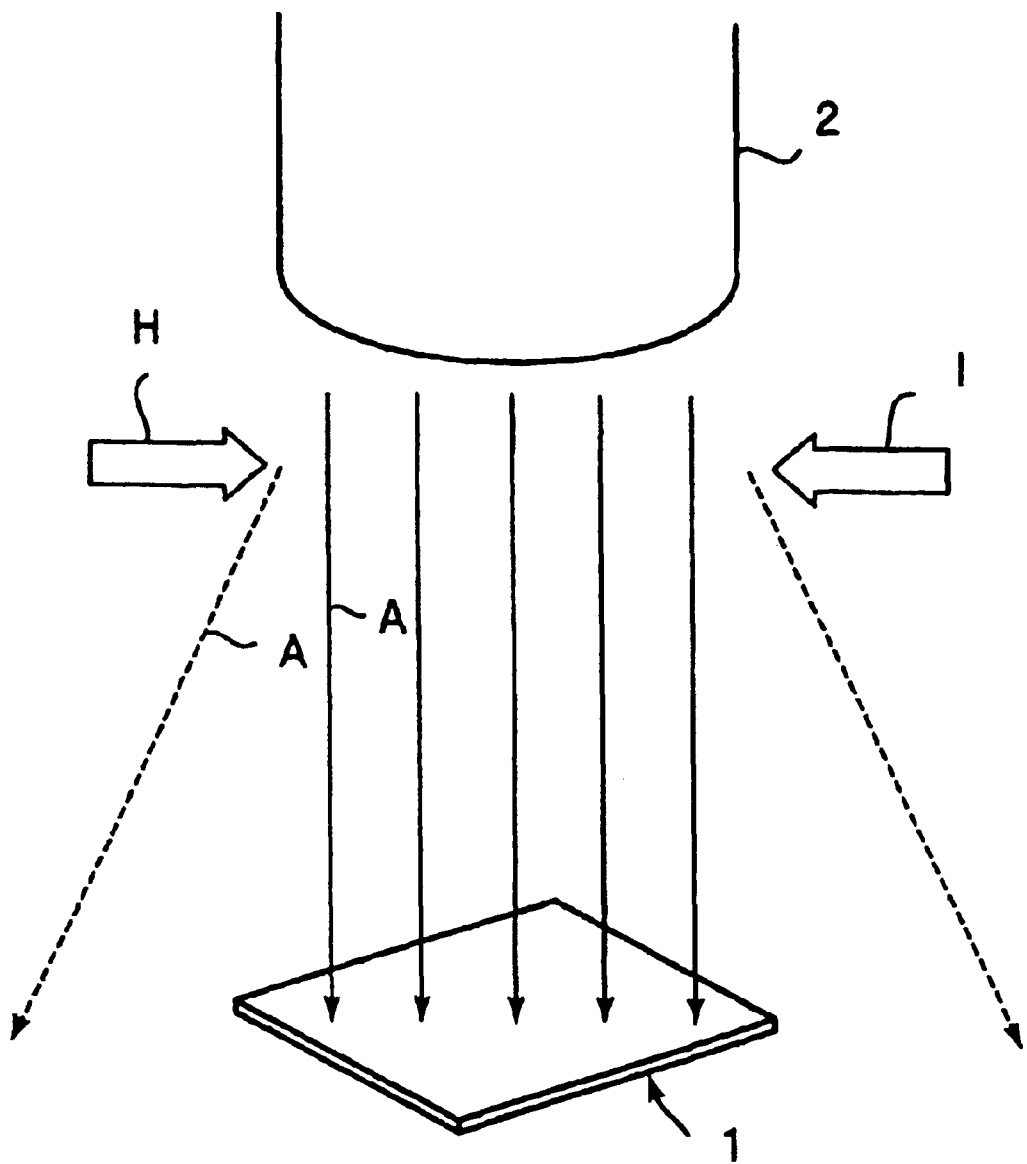
FIG. 5 is a schematic perspective view for illustrating a frequency adjustment method according to a third modified example of the preferred embodiment shown in FIG. 1.

In addition, when etching is performed by irradiating with the ion beam A, an electric field or a magnetic field may be applied as shown by arrows H and I in FIG. 5. With this arrangement, the ion beam A may be electromagnetically bent to be applied to the electrode of the upper surface of the surface acoustic wave device 1.

In the above-described preferred embodiment and modified examples, when the ion etching is performed on the electrode fingers 4a and 4b on the upper surface of the surface acoustic wave device 1, at least one of the surface acoustic wave device 1 and the ion gun 2 is moved in the X direction and/or in the Y direction. However, both of the surface acoustic wave device 1 and the ion gun 2 may be moved. Furthermore, the moving direction is not restricted to the X direction and/or the Y direction. In other words, according to the configuration of an electrode disposed on a surface of an electronic component and subjected to ion-beam etching to make the frequency adjustments, the moving direction is not limited to the X direction and the Y direction, as long as the direction is a direction within the surface on which the electrode is disposed.

Furthermore, the above-described preferred embodiments and modified examples describe the method for performing the ion-beam etching of a portion of the electrode fingers 4a and 4b of the surface acoustic wave device 1 shown in FIG. 2. However, the method for adjusting the frequency of an electronic component according to the present invention is not restricted only to the case of a surface acoustic wave device. The method can be used for other electronic components such as piezoelectric oscillators in which an oscillation electrode is disposed on a piezoelectric substrate, and other electronic components.

Furthermore, in the above surface acoustic wave device, the interdigital transducer 4 is arranged on the piezoelectric substrate. However, the "piezoelectric substrate" of the present invention includes not only such a piezoelectric substrate but also an insulating substrate having a piezoelectric thin film disposed thereon.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A method for adjusting the frequency of an electronic component device, the method comprising the steps of:

providing an electronic component device having an electrode disposed on a surface thereof;

etching the electrode disposed on the surface of the electronic component device by irradiating an ion beam on the electrode; wherein the ion beam irradiation is performed while moving at least one of the electronic component device and the ion beam in at least one direction along the surface of the electronic component device on which the electrode is disposed.

2. The method according to claim 1, wherein the ion beam irradiation is performed while moving at least one of the electronic component device and the ion beam in a plurality of directions within the surface of the electronic component device on which the electrode is disposed.

3. The method according to claim 1, wherein the ion beam irradiation is performed while moving each of the electronic component device and the ion beam in at least one direction within the surface of the electronic component device on which the electrode is disposed.

4. The method according to claim 1, wherein the ion beam irradiation is performed while the electronic component device is fixed and the ion beam is moved in at least one direction within the surface of the electronic component device on which the electrode is disposed.

5. The method according to claim 1, wherein the ion beam irradiation is performed while the ion beam is fixed and the electronic component device is moved in at least one direction within the surface of the electronic component device on which the electrode is disposed.

6. The method according to claim 1, wherein the at least one direction of moving is along a length dimension of the surface of the electronic component device.

7. The method according to claim 1, wherein the at least one direction of moving is along a width dimension of the surface of the electronic component device.

8. The method according to claim 1, wherein tho at least one direction of moving is along a direction other than a length dimension or a width dimension of the surface of the electronic component device.

9. The method according claim 1, wherein the electronic component device is a surface acoustic wave device.

10. The method according to claim 9, wherein the surface acoustic wave device includes a piezoelectric substrate and an interdigital transducer having a plurality of electrode fingers disposed on a surface of the plezoelectric substrate, and the ion beam irradiation is performed while moving at least one of the electronic component device and the ion beam in a direction in which the electrode fingers extend.

11. The method according to claim 1, wherein the electronic component comprises a piezoelectric oscillator.

12. The method according claim 1, wherein when the ion beam irradiation is performed, the ion beam is bent by applying an electric field or a magnetic field.

13. A method for adjusting the frequency of an electronic component device, the method comprising the steps of:

providing an electronic component device having an electrode disposed on a surface thereof;

etching the electrode disposed on the surface of the electronic component device by irradiating an ion beam on the electrode; wherein the ion beam irradiation is performed while moving at least one of the electronic component device and the ion beam along a length dimension and a width dimension of the surface of the electronic component device on which the electrode is disposed.

14. The method according to claim 13, wherein the ion beam irradiation is performed while moving each of the electronic component device and the ion beam in at least one direction within the surface of the electronic component device on which the electrode is disposed.

15. The method according to claim 13, wherein the ion beam irradiation is performed while the electronic component device is fixed and the ion beam is moved along the length dimension and the width dimension of the surface of the electronic component device on which the electrode is disposed.

16. The method according to claim 13, wherein the ion beam irradiation is performed while the ion beam is fixed and the electronic component device is moved along the length dimension and the width dimension of the surface of the electronic component device on which the electrode is disposed.

17. The method according to claim 13, wherein the ion beam irradiation is performed while moving at least one of the electronic component device and the ion beam along a direction other than the length dimension and the width dimension of the surface of the electronic component device.

18. The method according claim 13, wherein the electronic component device is a surface acoustic wave device.

19. The method according to claim 18, wherein the surface acoustic wave device includes a piezoeleotric substrate and an interdigital transducer having a plurality of electrode fingers disposed on a surface of the piezoelectric substrate, and the ion beam irradiation is performed while moving at least one of the electronic component device and the ion beam in a direction in which the electrode fingers extend.

20. The method according to claim 13, wherein the electronic component comprises a piezoelectric oscillator.

21. The method according claim 13, wherein when the ion beam irradiation is performed, the ion beam is bent by applying an electric field or a magnetic field.

* * * * *